(12) United States Patent
Akeboshi et al.

(10) Patent No.: US 10,529,588 B2
(45) Date of Patent: Jan. 7, 2020

(54) SUBSTRATE TREATMENT METHOD AND SUBSTRATE TREATMENT APPARATUS

(71) Applicant: TOSHIBA MEMORY CORPORATION, Tokyo (JP)

(72) Inventors: Yuya Akeboshi, Mie (JP); Hiroshi Tomita, Mie (JP); Hisashi Okuchi, Mie (JP); Yasuhito Yoshimizu, Mie (JP); Hiroaki Yamada, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/012,866

(22) Filed: Jun. 20, 2018

(65) Prior Publication Data

US 2018/0301349 A1 Oct. 18, 2018

Related U.S. Application Data

(63) Continuation of application No. 14/989,241, filed on Jan. 6, 2016, now Pat. No. 10,014,186.

(30) Foreign Application Priority Data

Jun. 1, 2015 (JP) .................. 2015-111556

(51) Int. Cl.
*H01L 21/3213* (2006.01)
*H01L 21/67* (2006.01)
*C23F 1/40* (2006.01)

(52) U.S. Cl.
CPC .......... *H01L 21/32134* (2013.01); *C23F 1/40* (2013.01); *H01L 21/6708* (2013.01); *H01L 21/67075* (2013.01); *H01L 21/67051* (2013.01)

(58) Field of Classification Search
CPC ................ C23F 1/40; H01L 21/32134; H01L 21/67075; H01L 21/67063; H01L 21/67051; H01L 21/6708
(Continued)

(56) References Cited

U.S. PATENT DOCUMENTS 5,364,510 A * 11/1994 Carpio ................... G05D 21/02
134/2
6,140,233 A 10/2000 Kwag et al.
(Continued)

FOREIGN PATENT DOCUMENTS

JP 03-39491 A 2/1991
JP 2004-3005 A 1/2004
(Continued)

*Primary Examiner* — Lan Vinh
(74) *Attorney, Agent, or Firm* — Finnegan, Henderson, Farabow, Garrett & Dunner, L.L.P.

(57) ABSTRACT

In accordance with an embodiment, a substrate treatment method includes bringing a first metallic film on a substrate into contact with a first liquid, mixing a second liquid into the first liquid, and bringing the first metallic film or a second metallic film different from the first metallic film into contact with a liquid in which the first liquid and the second liquid are mixed together to etch the first or second metallic film. The first liquid includes an oxidizing agent, a complexing agent, and water ($H_2O$) of a first content rate to etch the first metallic film. The second liquid includes water ($H_2O$) at a second content rate higher than the first content rate after the etching has started.

7 Claims, 3 Drawing Sheets

(58) Field of Classification Search
USPC .............. 156/345.17, 345.18, 345.21, 345.22
See application file for complete search history.

(56) References Cited

U.S. PATENT DOCUMENTS

| | | | |
|---|---|---|---|
| 6,232,228 | B1 | 5/2001 | Kwag et al. |
| 6,431,183 | B1* | 8/2002 | Konishi .................. C01B 13/10 134/1 |
| 6,586,145 | B2 | 7/2003 | Yokoi et al. |
| 6,727,178 | B2 | 4/2004 | Saitou et al. |
| 7,179,398 | B2 | 2/2007 | Park et al. |
| 7,479,205 | B2 | 1/2009 | Okuda et al. |
| 8,497,215 | B2 | 7/2013 | Doll et al. |
| 2004/0242000 | A1 | 12/2004 | Jo et al. |
| 2006/0183338 | A1 | 8/2006 | Kim et al. |
| 2007/0178706 | A1 | 8/2007 | Kim et al. |
| 2008/0035182 | A1* | 2/2008 | Nakatsukasa ..... H01L 21/02052 134/88 |
| 2008/0067148 | A1 | 3/2008 | Liu et al. |
| 2010/0029088 | A1 | 2/2010 | Mayer |
| 2010/0095805 | A1 | 4/2010 | Jiang |
| 2012/0325109 | A1* | 12/2012 | Kong .................. C23C 18/1651 106/1.22 |

FOREIGN PATENT DOCUMENTS

| | | |
|---|---|---|
| JP | 2005-45285 A | 2/2005 |
| JP | 2005-506712 A | 3/2005 |
| JP | 2012-501530 A | 1/2012 |
| JP | 2013-5871 A | 1/2013 |
| JP | 2013-161963 A | 8/2013 |

\* cited by examiner

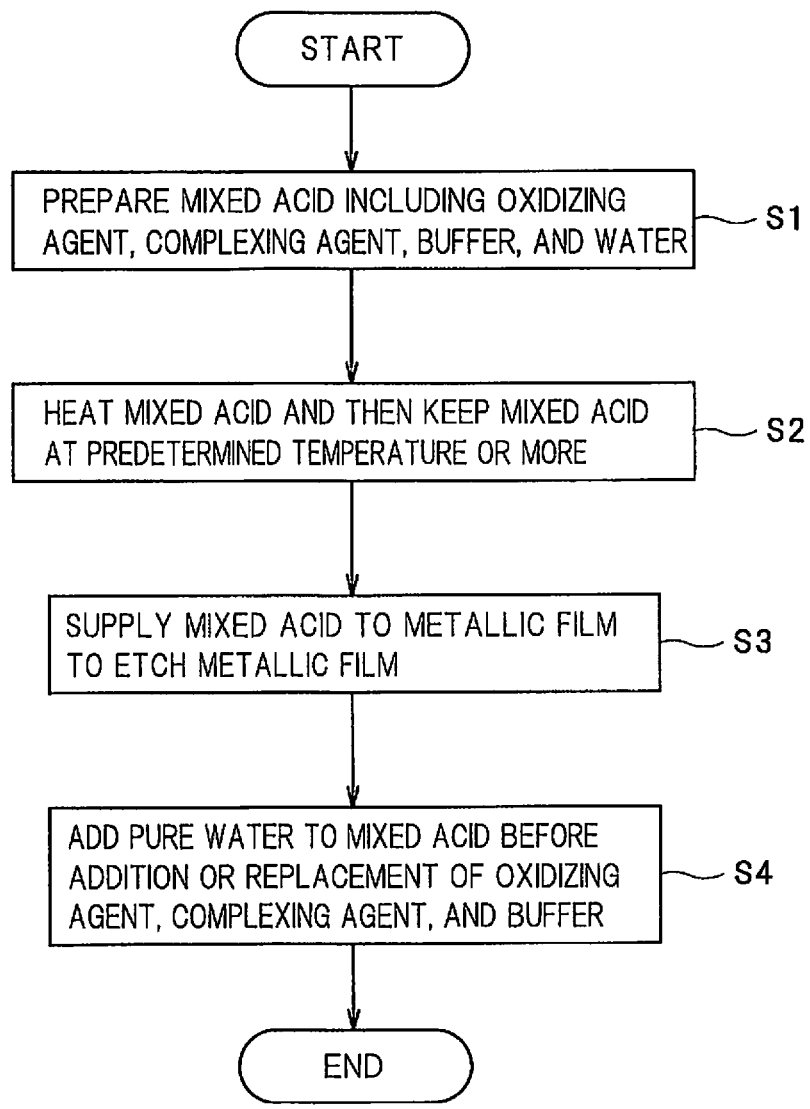
F I G. 1

SUBSTRATE TREATMENT METHOD AND SUBSTRATE TREATMENT APPARATUS

CROSS REFERENCE TO RELATED APPLICATIONS

This application is a continuation of U.S. application Ser. No. 14/989,241, filed Jan. 6, 2016, which is based upon and claims the benefit of priority from the prior Japanese Patent Application No. 2015-111556, filed on Jun. 1, 2015, the entire contents of which are incorporated herein by reference.

FIELD

Embodiments described herein relate generally to a substrate treatment method and a substrate treatment apparatus.

BACKGROUND

A mixed chemical (mixed acid) including a phosphoric acid and a nitric acid may be used in a process of removing (etching) a metallic film formed on a surface of a substrate such as a semiconductor wafer (hereinafter briefly referred to as a "wafer").

Recently, in response to higher integration in semiconductor devices, development has been shifted to a new device in which a stack film formed on a wafer is three-dimensionally processed from a conventional device having a two-dimensional planar structure. In such a device, the use of a process with the mixed acid is considered for the wet etching of the metallic film of the stack film.

However, films slightly insoluble in acids such as a metallic film including tungsten have the problem of the deterioration of etching characteristics.

BRIEF DESCRIPTION OF THE DRAWINGS

FIG. 1 is a flowchart showing the overview of a substrate treatment method according to one embodiment;

DETAILED DESCRIPTION

Figure 2:
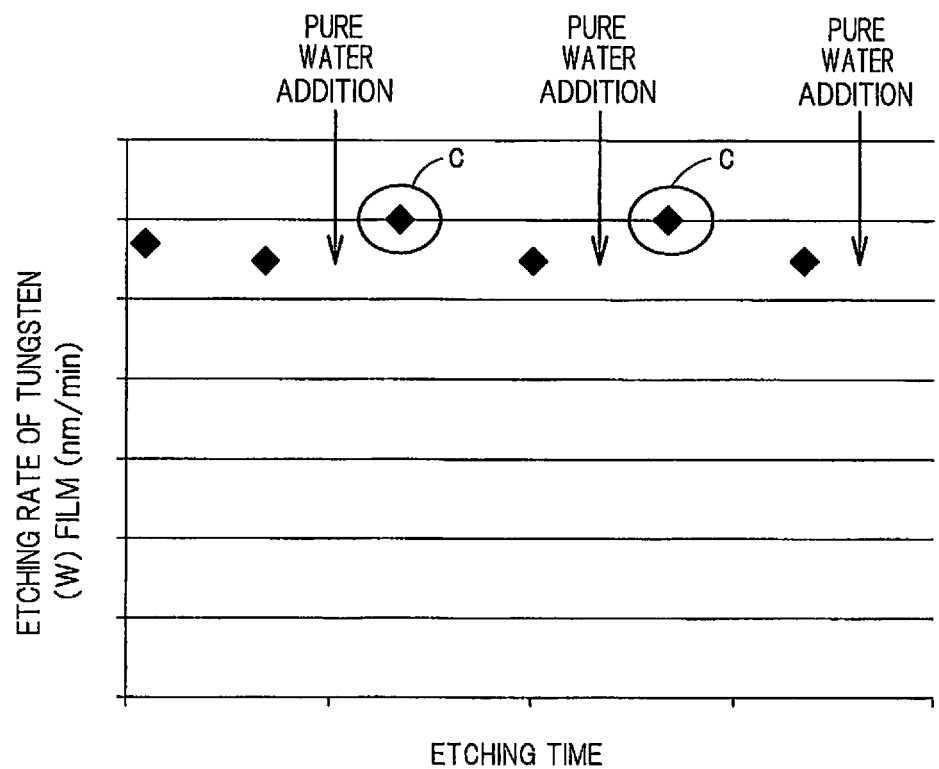
FIG. 2 is a graph showing an example of the change in the etching rate with the passing of time according to the substrate treatment method shown in FIG. 1.

In accordance with an embodiment, a substrate treatment method includes bringing a first metallic film on a substrate into contact with a first liquid, mixing a second liquid into the first liquid, and bringing the first metallic film or a second metallic film different from the first metallic film into contact with a liquid in which the first liquid and the second liquid are mixed together to etch the first or second metallic film. The first liquid includes an oxidizing agent, a complexing agent, and water ($H_2O$) of a first content rate to etch the first metallic film. The second liquid includes water ($H_2O$) at a second content rate higher than the first content rate after the etching has started.

Embodiments will now be explained with reference to the accompanying drawings.

A tungsten film is shown below as an example of a metallic film, and etching of this tungsten film is described by way of example. It should be understood that the metallic film is not limited to the tungsten film, and, for example, an aluminum (AL) film or a titanium nitride (TiN) film is also applicable.

In addition, like components are provided with like reference signs throughout the drawings and repeated descriptions thereof are appropriately omitted. Moreover, it is to be noted that the accompanying drawings illustrate the invention and assist in the understanding of the illustration and that the shapes, dimensions, and ratios and so on in each of the drawings may be different in some parts from those in an actual apparatus.

First, a manufacturing method of a semiconductor device according to one embodiment is described. FIG. 1 is a flowchart showing the schematic process of the manufacturing method of the semiconductor device according to the present embodiment.

As shown in FIG. 1, a mixed solution (hereinafter referred to as a "mixed acid") including an oxidizing agent, a complexing agent, and a buffer is first prepared (step S1).

The oxidizing agent includes, for example, at least one of a nitric acid ($HNO_3$), hydrogen peroxide water ($H_2O_2$), and ozone ($O_3$). In the present embodiment, the nitric acid ($HNO_3$) is used to oxidize a metal of a metallic film to be etched and then generate an oxide, and dissolve part of the metallic film into the mixed acid.

For example, a phosphoric acid ($H_3PO_4$) is selected as the complexing agent, and thereby complexes the metal oxide of the metallic film and dissolves the metal oxide into the mixed acid as a complex ion. An acetic acid ($CH_3COOH$) is selected as the buffer in the present embodiment, and thereby inhibits the generation of a nitric acid by-product, and preferentially volatilizes to inhibit the volatilization of the nitric acid and the phosphoric acid.

The mixed acid includes pure water ($H_2O$). The mixed acid is prepared in a chemical bath (see the sign 12 in FIG. 3), for example, in the case of an immersion type substrate treatment apparatus, or prepared in a chemical tank (see the sign 24 in FIG. 4) coupled to an etching treatment portion (see the sign 22 in FIG. 4), for example, in the case of a single-wafer type substrate treatment apparatus. In the present embodiment, the mixed acid before etching corresponds to, for example, a first liquid.

The mixed acid is then heated and kept at a predetermined temperature or more (step S2). This process is required when the treatment target is the slightly soluble metallic film. In the present embodiment, the tungsten film is targeted for a treatment, so that a temperature of 80° or more is maintained.

The mixed acid heated to 80° or more is then supplied to the treatment target metallic film, and the metallic film is thereby etched (step S3). The oxidizing agent generates a metal oxide in the mixed acid, and the phosphoric acid of the complexing agent forms the metal oxide into a complex ion and dissolves the complex ion into the mixed acid.

Components of the mixed acid change along with the etching. More specifically, the ratio of pure water contained in the mixed acid decreases along with the etching. As a result, the etching rate decreases by degrees. This is attributed to the fact that pure water volatilizes earlier than the other mixed acid components because the mixed acid during etching is at high temperature and that pure water also contributes to the reaction of complexing the metal oxide.

Therefore, even if the mixed acid having the same composition as that at the start of the etching is added during the etching treatment, the ratio of pure water contained in the mixed acid only slightly recovers, and the etching rate is not improved much.

Thus, pure water is added to the mixed acid during the etching treatment, specifically, before addition or after replacement of the oxidizing agent, the complexing agent, and the buffer (step S4). The substance to be added is not exclusively pure water. It is possible to use a substance which has compositions similar to those of the mixed acid but in which the ratio of pure water is higher than the ratio of pure water in the mixed acid used at the start of the etching. It is also possible to use a mixed acid which has compositions different from the compositions of the mixed acid at the start of the etching but in which the ratio of pure water is higher than the ratio of pure water in the mixed acid used at the start of the etching. In the present embodiment, the substance added in step S4 corresponds to, for example, a second liquid. Moreover, in the present embodiment, the ratio of pure water in the mixed acid used at the start of the etching corresponds to, for example, a first content rate, and the ratio of pure water in the substance to be added corresponds to, for example, a second content rate.

The timing of addition may be the time in which the etching treatment for the same treatment target is being conducted or may be the time in which the treatment target is replaced with another one. The amount of pure water to be added is set to an amount suitable to the improvement of the etching rate in consideration of, for example, the amount of the mixed acid at the start of the etching and the size and thickness of the treatment target metallic film.

FIG. 2 is a graph showing an example of the change in the etching rate with the passing of time according to the manufacturing method in the present embodiment. As shown in FIG. 2, it is apparent that the etching rate gradually decreases along with the etching time but the etching rate increases whenever pure water is added (see the sign C in FIG. 2), which enables stable etching. The decrease of the etching rate may be monitored, and pure water may be added at the point where the etching rate has become less than or equal to a predetermined value. Alternatively, pure water may be added at the point where a predetermined length of time has elapsed since the start of the etching.

According to the substrate treatment method in at least one embodiment described above, pure water is added to the mixed acid during the etching treatment, so that the etching rate of the metallic film can be stabilized. Consequently, the metallic film can be stably etched with high controllability.

Figure 3:
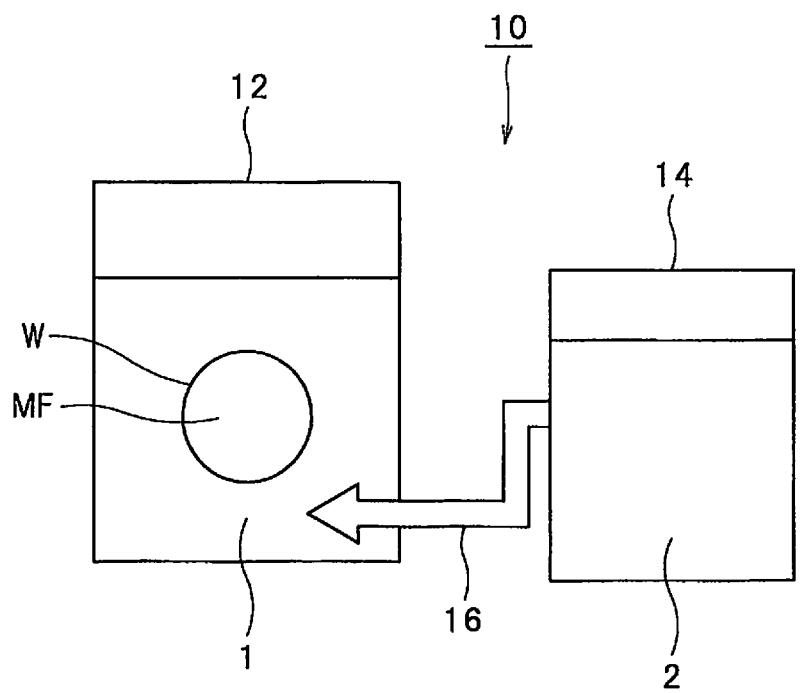
FIG. 3 is a diagram showing the schematic configuration of a substrate treatment apparatus according to Embodiment 1.
Figure 4:
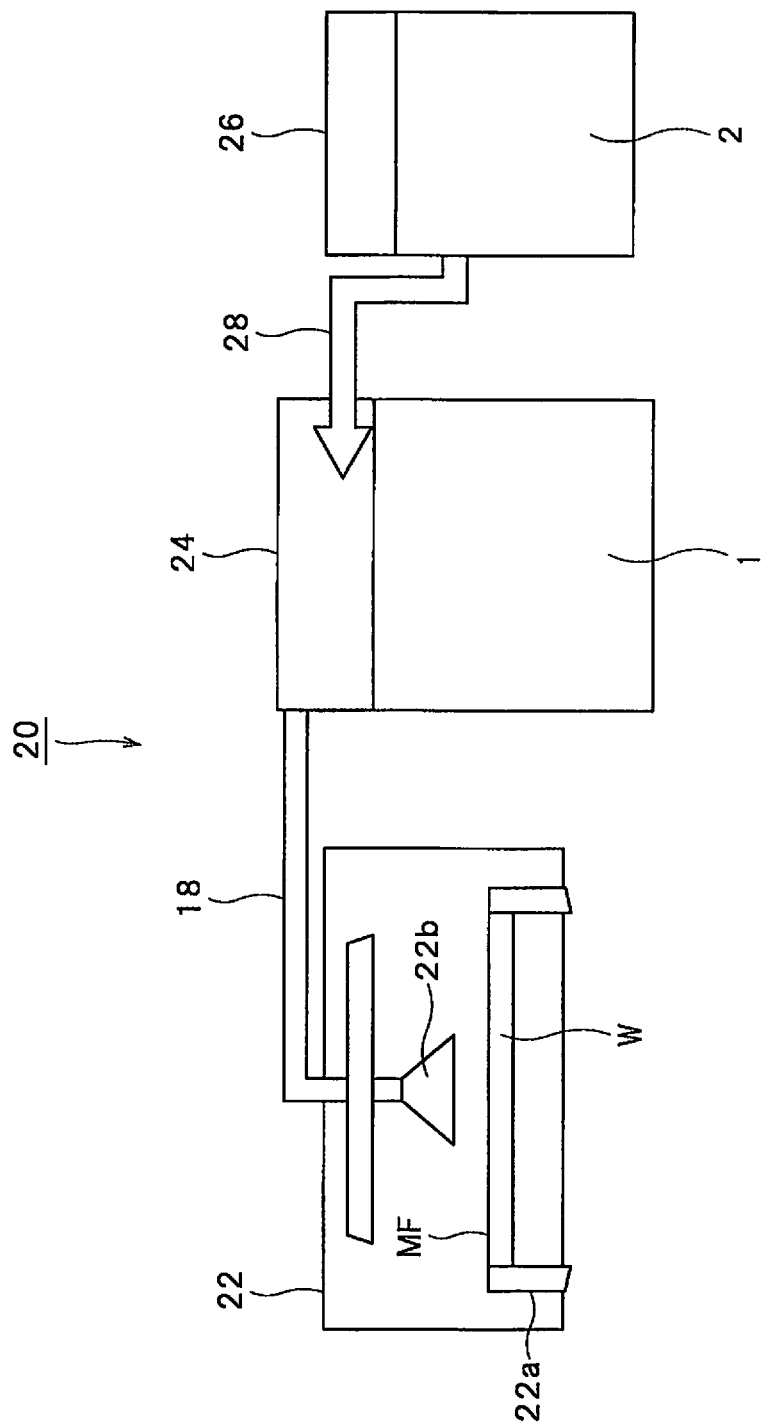
FIG. 4 is a diagram showing the schematic configuration of a substrate treatment apparatus according to Embodiment 2.

Next, etching apparatuses suitable to the implementation of the above-mentioned substrate treatment method are described as substrate treatment apparatuses according to Embodiment 1 and Embodiment 2 with reference to FIG. 3 and FIG. 4.

An etching apparatus 10 shown in FIG. 3 is an example of an immersion type substrate treatment apparatus, and includes a chemical bath 12, a chemical tank 14, and a chemical addition line 16 provided between the chemical bath 12 and the chemical tank 14. The chemical tank 14 is coupled to the chemical bath 12 by the chemical addition line 16.

The chemical bath 12 is coupled to an unshown heating circulation mechanism. For example, a mixed acid 1 kept at a high temperature of 80° or more is supplied to the chemical bath 12, and is retained in the chemical bath 12. A wafer W in which a treatment target metallic film MF is formed is immersed in the mixed acid 1 and etched. In the present embodiment, the mixed acid 1 at the start of the etching corresponds to, for example, a first liquid, and the chemical bath 12 corresponds to, for example, a first container.

Pure water 2 is retained in the chemical tank 14. A predetermined amount of the pure water 2 is added to the chemical bath 12 via the chemical addition line 16 at a predetermined timing during the etching treatment and then mixed into the mixed acid 1. In the present embodiment, the chemical tank 14 corresponds to, for example, a second container, the pure water 2 corresponds to, for example, a second liquid, and the chemical addition line 16 corresponds to, for example, a liquid supply path.

According to the etching apparatus 10 shown in FIG. 3, the pure water in the chemical tank 14 is added to and mixed into the mixed acid 1 in the chemical bath 12 during the etching treatment, so that the etching rate in the metallic film MF can be stabilized. Consequently, the metallic film MF can be stably etched with high controllability.

An etching apparatus 20 shown in FIG. 4 is an example of a single-wafer type substrate treatment apparatus, and includes the etching treatment portion 22, the chemical tanks 24 and 26, and chemical addition lines 18 and 28. The chemical addition line 28 is provided between the chemical tank 24 and the chemical tank 26, and the chemical tank 26 is coupled to the chemical tank 24 by the chemical addition line 28. The chemical addition line 18 is provided between the etching treatment portion 22 and the chemical tank 24, and the chemical tank 24 is coupled to the etching treatment portion 22 by the chemical addition line 18.

The etching treatment portion 22 is provided with a holding table 22a and a nozzle 22b. The holding table 22a holds the wafer W in which the treatment target metallic film MF is formed. The nozzle 22b has a discharge opening to discharge, to the wafer W, the mixed acid 1 coming from the chemical tank 24 via the chemical addition line 18.

The chemical tank 24 is coupled to an unshown heating circulation mechanism. The mixed acid 1 kept at a high temperature of, for example, 80° or more is supplied to and retained in the chemical tank 24. The pure water 2 is retained in the chemical tank 26. A predetermined amount of the pure water 2 is added to the chemical tank 24 from the chemical tank 26 via the chemical addition line 28 at a predetermined timing during the etching treatment, including a timing, for example, when the treatment target wafer W is replaced.

In the present embodiment, the mixed acid 1 at the start of the etching corresponds to, for example, a first liquid, and the chemical tank 24 corresponds to, for example, a first container. Moreover, in the present embodiment, the pure water 2 corresponds to, for example, a second liquid, the chemical tank 26 corresponds to, for example, a second container, the chemical addition line 28 corresponds to, for example, a first liquid supply path, and the chemical addition line 18 corresponds to, for example, a second liquid supply path.

According to the etching apparatus 20 shown in FIG. 4, a predetermined amount of pure water in the chemical tank 26 is mixed into the mixed acid 1 in the chemical tank 24 at a predetermined timing, so that the mixed acid in which the amount of pure water has increased is discharged to the wafer W from the nozzle 22b. Thus, the etching rate in the metallic film MF on the wafer W can be stabilized. Consequently, the metallic film MF can be stably etched with high controllability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
a chemical bath containing a first liquid comprising an oxidizing agent, a complexing agent, and water ($H_2O$), the water in the first liquid being at a first content rate to etch a metallic film on a substrate immersed in the first liquid in the chemical bath;
a chemical tank containing a second liquid comprising the oxidizing agent, the complexing agent, and water ($H_2O$), the water in the second liquid being at a second content rate higher than the first content rate; and
a liquid supply path provided between the chemical bath and the chemical tank to supply the second liquid in the chemical tank to the chemical bath to mix the second liquid with the first liquid in the chemical bath,
wherein the chemical tank is configured to supply the second liquid to the chemical bath at the point where an etching rate of the first liquid has become less than or equal to a predetermined value.

2. The apparatus of claim 1,
wherein the chemical bath is configured to contain the substrate to be etched.

3. The apparatus of claim 1,
wherein the oxidizing agent comprises at least one of a nitric acid ($HNO_3$), hydrogen peroxide water ($H_2O_2$), and ozone ($O_3$).

4. The apparatus of claim 1,
wherein the complexing agent comprises a phosphoric acid ($H_3PO_4$).

5. A substrate treatment apparatus comprising:
a first chemical tank containing a first liquid comprising an oxidizing agent, a complexing agent, and water ($H_2O$), the water in the first liquid being at a first content rate to etch a metallic film on a substrate;
a second chemical tank containing a second liquid comprising the oxidizing agent, the complexing agent, and water ($H_2O$), the water in the second liquid being at a second content rate higher than the first content rate;
a first liquid supply path provided between the first and second chemical tanks to supply the second liquid in the second chemical tank to the first chemical tank to mix the second liquid with and the first liquid in the first chemical tank;
an etching chamber configured to contain the substrate to be etched;
a second liquid supply path configured to supply the first liquid or a liquid in which the first liquid and the second liquid are mixed together to the etching chamber from the first chemical tank; and
a nozzle configured to supply the substrate with the first liquid or the first liquid mixed with the second liquid which has been supplied through the second liquid supply path,
wherein the second chemical tank is configured to supply the second liquid to the first chemical tank at the point where an etching rate of the first liquid has become less than or equal to a predetermined value.

6. The apparatus of claim 5,
wherein the oxidizing agent comprises at least one of a nitric acid ($HNO_3$), hydrogen peroxide water ($H_2O_2$), and ozone ($O_3$).

7. The apparatus of claim 5,
wherein the complexing agent comprises a phosphoric acid ($H_3PO_4$).

* * * * *